(12) United States Patent
Bogart et al.

(10) Patent No.: US 8,524,099 B2
(45) Date of Patent: Sep. 3, 2013

(54) METHODS FOR ACCESSING A PROCESS CHAMBER USING A DUAL ZONE GAS INJECTOR WITH IMPROVED OPTICAL ACCESS

(75) Inventors: Jeff A. Bogart, Campbell, CA (US); Leonard Sharpless, Fremont, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 102 days.

(21) Appl. No.: 12/987,030

(22) Filed: Jan. 7, 2011

(65) Prior Publication Data

US 2011/0103805 A1 May 5, 2011

Related U.S. Application Data

(62) Division of application No. 11/544,316, filed on Oct. 6, 2006, now Pat. No. 7,928,366.

(51) Int. Cl.
*G01L 21/30* (2006.01)
(52) U.S. Cl.
USPC ..... 216/59; 216/58; 156/345.48; 204/298.26; 204/298.03; 204/192.13
(58) Field of Classification Search
USPC ........... 216/58, 59; 156/345.48; 204/298.26; 204/298.03, 192.13
See application file for complete search history.

(56) References Cited

U.S. PATENT DOCUMENTS

| | | | | |
|---|---|---|---|---|
| 5,793,042 | A * | 8/1998 | Quick | 250/339.08 |
| 6,919,279 | B1 * | 7/2005 | Rulkens et al. | 438/706 |
| 2003/0070620 | A1 * | 4/2003 | Cooperberg et al. | 118/723 AN |

FOREIGN PATENT DOCUMENTS

| | | |
|---|---|---|
| CN | 1323444 A | 11/2001 |
| CN | 101473060 A | 7/2009 |
| JP | 8-106992 | 4/1996 |
| JP | 8106992 A | 4/1996 |
| JP | 2000-349070 | 12/2000 |
| JP | 2002-540625 | 11/2002 |
| JP | 2005-507159 | 3/2005 |
| WO | WO 00/59009 | 5/2000 |
| WO | WO 03/034463 A2 | 4/2003 |

OTHER PUBLICATIONS

Luo.L. et al. New Journal of Physics, vol. 8, (2006), Jan. 2011.*
(Patent Abstract of Japan) JP2002-540625, Nov. 26, 2002, Japan.
(Patent Abstract of Japan) JP2005-507159, Mar. 10, 2005, Japan.

* cited by examiner

*Primary Examiner* — Nadine G Norton
*Assistant Examiner* — Maki Angadi
(74) *Attorney, Agent, or Firm* — Martine Penilla Group LLP (57) ABSTRACT

Methods for processing events occurring in a process chamber are provided. In one method, an operation includes carrying gas and receiving an optical signal from the process chamber to an analysis tool that operates in response to the optical signal having a signal-to-noise ratio (SNR) for process analysis. And, dividing the carried gas and optical signal into a plurality of separate gas and optical signals between the process chamber and the analysis tool. The dividing is configured through separate apertures so that the apertures collectively maintain the SNR of the optical signal received at the tool. Methods provide a septum in a second bore dividing the second bore into apertures configured to reduce etching of and deposition on the optical access window and to maintain the desired SNR at the diagnostic end point.

15 Claims, 7 Drawing Sheets

METHODS FOR ACCESSING A PROCESS CHAMBER USING A DUAL ZONE GAS INJECTOR WITH IMPROVED OPTICAL ACCESS

CLAIM OF PRIORITY

This application is a divisional application, claiming priority under 35 USC 120, of U.S. application Ser. No. 11/544,316, filed on Oct. 6, 2006 now U.S. Pat. No. 7,928,366, and is herein incorporated by reference.

RELATED APPLICATIONS

This application is related to U.S. patent application Ser. No. 11/472,017, filed Jun. 20, 2006 for "Apparatus For Shielding Process Chamber Port Having Dual Zone and Optical Access Features", in the names of Fangli J. Hao, Leonard Sharpless, and Harmeet Singh (the "Second Prior Application"). The Second Prior Application was a continuation-in-part of U.S. patent application Ser. No. 11/341,079, filed Jan. 26, 2006 for "Apparatus For Shielding Process Chamber Port" in the names of Fangli J. Hao, John E. Daugherty, and Allan K. Ronne (the "First Prior Application"). This application is also related to the First Prior Application. The disclosure of each of the First Prior Application and the Second Prior Application is incorporated by reference.

BACKGROUND

1. Field

The present invention relates generally to semiconductor manufacturing and, more particularly, to methods of and apparatus for accessing a process chamber, wherein the access may be optical access through an optical access window, and protection of the optical access window from damage due to conditions originating in the process chamber is facilitated by an improved two-piece configuration of an injector.

2. Description of the Related Art

Vacuum processing chambers have been used for etching materials from substrates and for deposition of materials onto substrates. The substrates have been semiconductor wafers, for example. U.S. Pat. No. 6,230,651 to Ni et al. issued May 15, 2001 (assigned to Lam Research Corporation, the assignee of the present application) is incorporated herein by reference and illustrates an opening, or port, in a dielectric chamber window at a top of a processing chamber to provide access to an interior of the processing chamber, for etching and other processing of semiconductor substrates, for example. For large diameter substrates, center gas injection through the port of the dielectric chamber window was said to ensure uniform etching and deposition, for example, thus improving the access to such processing chambers.

However, as industry standards increased, further improvements were required to provide even better access to such processing chambers. For example, there was a need to monitor the processes in the chambers, which requires chamber access in addition to access for gas supply. When monitoring an optical signal that may indicate a process condition in the process chamber, an opening, referred to as a clear optical aperture, extended through the dielectric chamber window. Such opening, or clear optical aperture, is configured with a straight unobstructed line of sight, thus "clear" is used to describe the optical aperture. Difficulties arose, however, when the clear optical aperture was physically open to the chamber, because plasma may form in the clear optical aperture. Such plasma formation relates to a threshold electric field strength required to initiate a plasma, which threshold strength is based on gas pressure in and the diameter of a bore of the clear optical aperture that is used to supply the gas to the chamber. The Second Prior Application described those two factors of plasma formation in the gas supply bore. Attempts are generally made to reduce this diameter of the gas supply bore, because the gas pressure tends to be specified by process requirements and generally may not be varied for suppressing plasma formation. The Second Prior Application also taught that when there is multiple, or simultaneous, use of the clear optical aperture (i.e., use simultaneously for both optical access and gas supply functions) the multiple use presents conflicting requirements. That is, for the aspect of facilitating monitoring (or diagnosis) of the optical signal that indicates a process condition in the process chamber, there is a need to increase the diameter of the gas supply bore of the clear optical aperture. For example, in providing optical access for interferometric or spectroscopic observation of chamber processes, the diameter of such gas supply bore must generally be not less than a minimum value, which was defined as about one-half inch, for example. This diameter was described as a minimum diameter that is required to enable proper access to the optical signal, and was referred to in the Second Prior Application as the "minimum diameter of the clear optical aperture". However, the analysis in the Second Prior Application indicated that for the gas supply aspect of the multiple use there was a need for a relatively small diameter (significantly less than 0.5 inch) of the gas supply bore of the clear optical aperture that supplies gas to the chamber, for avoiding plasma formation in the gas supply bore, for example. This analysis also indicated that to facilitate the multiple use, an optical access window must be used to seal the clear optical aperture so as to maintain a vacuum in the processing chamber, and that the optical access window should be mounted at a location at which the strength of the electric field is substantially reduced. Such mounting was to reduce damage to the optical window, e.g., to reduce damage from plasma formation in the clear optical aperture that reduces window clarity. Such plasma may create particulate contamination and promote deposition onto the optical access window. Thus, the analysis in the Second Prior Application indicated that there is not only the minimum diameter of the gas supply bore of the clear optical aperture, which is in conflict with the need for a small diameter gas supply bore, but that there is also a minimum length of such gas supply bores of the clear optical aperture necessary to reduce such contamination and damage to the optical access window that facilitates the multiple use.

In the Second Prior Application this minimum diameter of the clear optical aperture was compared to gas bore passages provided in shielded gas inlets described, for example, in U.S. Pat. No. 6,500,299, issued Dec. 31, 2002 to Mett, et al. Although multiple ones of such passages are provided, the passages are provided only for supplying gas to a process chamber. For such purpose the gas is supplied through grains of dielectric materials such as ceramics, and the passages are defined by interconnected pores of the porous ceramic that do not provide a clear unobstructed line of sight as is required for optical signal transmission. Such passages are thus not suitable for providing clear optical access for the exemplary interferometric or spectroscopic observation of chamber processes. Moreover, it was noted in the Second Prior Application that to mount such passages of a gas bore inside a metal cup and to insert the cup in the side wall of a process chamber as described in the Mett et al. patent, would undesirably subject the metal cup to the plasma in the chamber, for example, and introduce problems in sealing the metal cup to the wall of the process chamber.

The applicants of the present application have determined that as industry requirements or standards have increased beyond those for which the First and Second Prior Applications were directed, and beyond the use of such interconnected pores in ceramic materials for gas supply, further improvements are required to provide even better access to such processing chambers for simultaneous gas supply and optical access through a clear optical aperture, and to do so at less cost for components. For example, the present applicants have identified a need for further improvements that would provide the benefits of the all-ceramic, single piece injector of the Second Prior Application that provided multiple access (i.e., simultaneous gas supply and optical access) to a process chamber, and to have those benefits without the following considerations: (1) requiring the injector to be fabricated from ceramic material, but allowing use of ceramic materials when appropriate, or (2) requiring the injector to be coated with materials such as cerium oxide, zirconium oxide, yttria-stabilized zirconia, thermally-sprayed aluminum oxide, or yttrium oxide deposited on the access aperture protect ceramic materials from the effects of the process plasma, or (3) depositing damaging deposits of particles on an optical access window leading into the injector, or (4) requiring long spacing of an optical access window from the process chamber window to avoid damage to the optical access window, all while facilitating geometric advantages in an improved injector.

In view of the foregoing, the need for methods of and apparatus for providing further improvements in accessing processing chambers includes ways to provide improved multiple access (e.g., simultaneous gas supply and optical access through a clear optical aperture) to a process chamber. This need also includes providing such improved access when the access is for dual zone gas supply, and when the optical access is subject to the conflicting requirements of a relatively large minimum diameter of the clear optical aperture (for optimum optical access) and of a relatively small diameter of a gas bore for gas supply to the chamber, e.g., to avoid plasma formation in the gas bore. The problem presented, then, is how to such provide further improvements in accessing processing chambers, and how to provide such improved access when the access is for dual zone gas supply, and when the optical access is subject to the above conflicting requirements, without the four above considerations.

SUMMARY

Broadly speaking, embodiments of the present invention fill these needs by providing methods of and apparatus for accessing a process chamber, wherein the access may be simultaneous gas supply into the process chamber and clear optical access through an optical access window into the process chamber, and wherein protection of the optical access window from damage due to conditions originating in the process chamber is facilitated. These embodiments fill the above needs by providing the benefits of the all-ceramic, single piece injector of the Second Prior Application that provided multiple access (i.e. simultaneous gas supply and clear optical access through one clear optical aperture) to a process chamber, and by providing those benefits without the foregoing considerations, all while facilitating geometric advantages of an improved injector.

In one embodiment, methods for processing events occurring in a process chamber are provided. In one method, an operation includes carrying gas and receiving an optical signal from the process chamber to an analysis tool that operates in response to the optical signal having a signal-to-noise ratio (SNR) for process analysis. And, dividing the carried gas and optical signal into a plurality of separate gas and optical signals between the process chamber and the analysis tool. The dividing is configured through separate apertures so that the apertures collectively maintain the SNR of the optical signal received at the tool. Methods provide a septum in a second bore dividing the second bore into apertures configured to reduce etching of and deposition on the optical access window and to maintain the desired SNR at the diagnostic end point.

Embodiments of the present invention may include a gas injector for a process chamber configured with an optical access window allowing optical access to and from the process chamber. A sleeve may be configured with a bore defining a path for gas and for the optical access. The bore may be configured with an access area for flowing process gas and transmitting an optical access signal having a desired signal-to-noise ratio (SNR). A septum may be configured for reception in the bore, the septum being further configured to divide the access area of the bore into at least two separate access apertures. Each of the at least two separate access apertures may be configured to cooperate with the other access aperture to flow the process gas and to transmit the optical access signal having the desired SNR through the optical access window.

Embodiments of the present invention may also include a gas injector for simultaneously transmitting an optical signal along an optical path from a process chamber through an optical access window to a diagnostic end point outside the process chamber and injecting a first process gas into the process chamber. The gas injector may include a housing configured to receive the process gas, the housing being further configured with a hollow body surrounding the optical path and mounting the optical access window adjacent to the diagnostic end point. A sleeve may also be configured for reception in the hollow body to define a bore surrounding the optical path and configured with an optical access area for simultaneously injecting the process gas into the process chamber and for allowing optical access by an optical signal from the process chamber through the optical access window. The optical signal may have at least a minimum signal-to-noise ratio (SNR). A septum may be configured for reception in the gas bore, and may be configured to divide the optical access area into a plurality of optical signal apertures. Each of the optical signal apertures may be configured so that the optical signal apertures collectively transmit through the optical access window the optical access signal having at least the minimum SNR.

Embodiments of the present invention may further include a method for optical access to process events occurring in a process chamber. The method may include an operation of defining a unitary gas and optical access path configured to carry gas and transmit an optical signal from the process chamber to an analysis tool that operates in response to the signal having a desired signal-to-noise ratio (SNR) for process analysis. The defined path configuration may provide clear optical access and be capable of transmitting the desired SNR that is high enough for the tool to accurately indicate the process analysis. The method may also include an operation of dividing the unitary gas and optical access path into a plurality of separate gas and optical access apertures between the process chamber and the analysis tool. The dividing configures the separate apertures so that the apertures collectively maintain the desired SNR of the optical signal transmitted to the tool while continuing to provide the clear optical access.

It will be obvious; however, to one skilled in the art, that embodiments of the present invention may be practiced without some or all of these specific details. In other instances, well known process operations have not been described in detail in order not to obscure the present invention.

BRIEF DESCRIPTION OF THE DRAWINGS

The embodiments of the present invention will be readily understood by reference to the following detailed description in conjunction with the accompanying drawings in which like reference numerals designate like structural elements, and wherein.

Other aspects and advantages of embodiments of the invention will become apparent from the following detailed description, taken in conjunction with the accompanying drawings, illustrating by way of example the principles of embodiments of the present invention.

DETAILED DESCRIPTION

In the following description, numerous specific details are set forth in order to provide a thorough understanding of embodiments of the present invention. It will be apparent, however, to one skilled in the art that the present invention may be practiced without some or all of these specific details. In other instances, well known process operations have not been described in detail in order not to obscure the present invention.

Embodiments of an invention are described including a gas injector for a process chamber configured with an optical access window allowing optical access to and from the process chamber. A sleeve may be configured with a bore defining a path for gas and for the optical access. The bore may be configured with an access area for flowing process gas and transmitting an optical access signal having a desired signal-to-noise ratio (SNR). A septum may be configured for reception in the bore, the septum being further configured to divide the access area of the bore into at least two separate access apertures. Each of the at least two separate access apertures may be configured to cooperate with the other access aperture to flow the process gas and to transmit the optical access signal having the desired SNR through the optical access window.

The described embodiments may further include a method for optical access to process events occurring in a process chamber. The method may include an operation of defining a unitary gas and optical access path configured to carry gas and transmit an optical signal from the process chamber to an analysis tool that operates in response to the signal having a desired signal-to-noise ratio (SNR) for process analysis. The defined path configuration may be capable of transmitting the desired SNR that is high enough for the tool to accurately indicate the process analysis. The method may also include an operation of dividing the unitary gas and optical access path into a plurality of separate gas and optical access apertures between the process chamber and the analysis tool. The dividing configures the separate apertures so that the apertures collectively maintain the desired SNR of the optical signal transmitted to the tool while continuing to provide the clear optical access.

Figure 1:
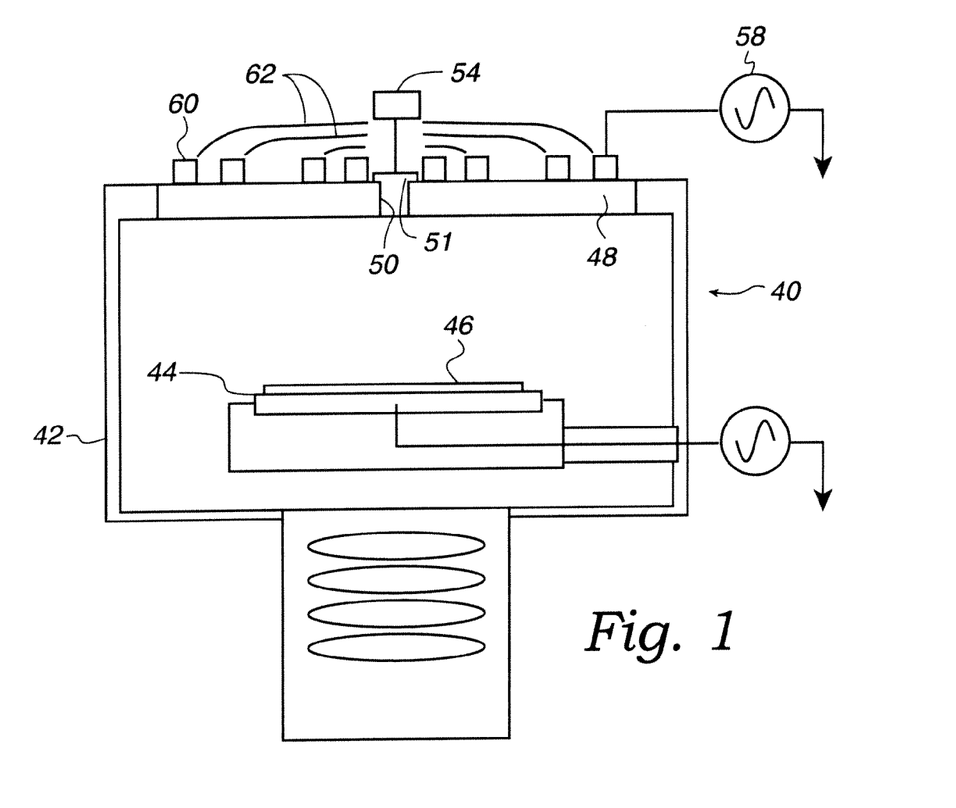
FIG. 1 is a schematic view of an embodiment of an apparatus of the present invention for multiple access to a process chamber, the access being facilitated by an injector having an improved configuration.

FIG. 1 shows a schematic view of an embodiment of apparatus 40 of the present invention for providing multiple access to a process chamber, such access facilitated by an injector configured for simultaneous improved multiple gas injection and clear optical access by process analysis and measurement tools. The access is through an access region that is protected from an electric field generated adjacent to a window of the chamber. The access region may allow access to a semiconductor manufacturing process chamber, for example. The electric field is applied to the process chamber adjacent to the access region through which the multiple access is provided for the simultaneous exemplary gas injection and use of the process analysis and measurement tools according to embodiments of the present invention.

FIG. 1 shows the apparatus 40 including a vacuum processing chamber 42 having a substrate holder 44 providing a suitable clamping force to a substrate 46 that is processed in semiconductor manufacturing operations, for example. Such substrate may, e.g., be a semiconductor wafer, or another base that is processed in making a device or component. The top of the chamber 42 may be provided with a chamber window, such as a dielectric window, 48. A port 50 is shown provided in the window 48 to permit the multiple access to the interior of the chamber 42, such as by an injector 51 of embodiments of the present invention.

Figures 2A, 2B:
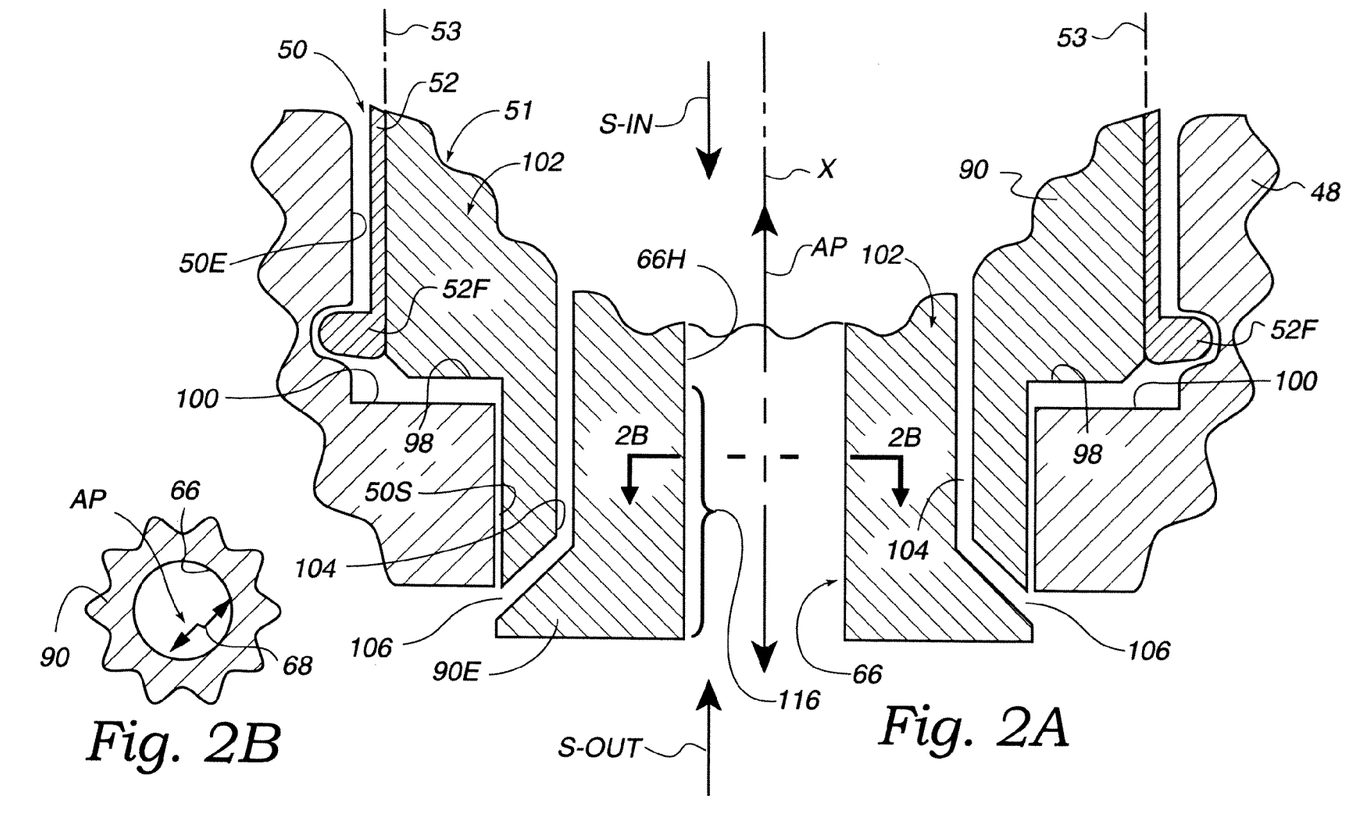
FIG. 2A is a side cross-sectional view of an embodiment of a chamber window having a port into which an injector of embodiments of the present invention is inserted, illustrating a shield in the port for protecting an access region from an electric field and a housing received in the shield as a first part providing the improved multiple access.
FIG. 2B is a cross-sectional view of the embodiment of the chamber window shown in FIG. 2A taken on line 2B-2B in FIG. 2A showing a cross section of a multiple, gas and optical access area of the injector.

FIG. 2A is a cross-sectional view of an embodiment of the window 48 configured with the port 50, illustrating a port section 50E having a large diameter and a port section 50S having a smaller diameter. FIG. 2A also illustrates a shield 52 in the section 50E of the port for protecting an access region 53 from an electric field. Spaced vertical dot-dot-dash lines define an exemplary cylindrical access region 53. The access region may thus be a three-dimensional volume within an exemplary hollow cylinder defined by those lines. In the embodiment of the access region 53 shown in FIG. 2A, the access region 53 extends into the window 48 and has a portion co-extensive with the large diameter section 50E, as described in the First Prior Application, which has been incorporated by reference. FIG. 2A also shows the injector 51 of an embodiment of the present invention configured with a large diameter exterior section received in the section 50E and a small diameter exterior section received in the section 50S of the port 50.

FIG. 1 also schematically shows the chamber 42 provided with facilities 54 that require access to the chamber 48 via the port 50. The facilities 54 may require such access to facilitate conducting deposition or etching processes in the chamber 42, such as by supplying process gases to the chamber. As one example of the facilities 54, process gases may be supplied from one or more gas supplies through the access region 52 and the injector 51 into the chamber 42. With a pump (not shown) reducing the pressure in the chamber 42 for the deposition or etching processes, a source 58 of RF energy with an impedance matching circuit is connected to a coil 60 to energize the gas in the chamber and maintain a high density (e.g., $10^{-11}$ to $10^{-12}$ ions/cm3) plasma in the chamber 42. The coil 60 may be the type that inductively couples RF energy into the chamber 42 through the window 48 to provide the high density plasma for conducting the deposition or etching processes in the chamber 42. During that coupling, the coil 60 generates an electric field (see lines 62, FIG. 1).

The facilities 54 may also require access to the chamber 48 via the access region 53 when the facilities include tools (referred to as 54T, FIG. 7B) that require access to the chamber 42 for process analysis, diagnosis or measurement as described below. The access by the tools 54T may be referred to as "optical access", and may be directed by the tool 54T along an axial path illustrated by an exemplary line AP in FIG. 2A. As an example of the optical access, FIG. 2A shows an input optical signal, or signal, S-IN that the tool 54T may configure as collimated white light. The signal S-IN may be directed by the tool 54T through the injector 51 along the axial path onto a surface oft the substrate 46 (FIG. 1) that is being processed in the chamber 48. As an example of process analysis, diagnosis or measurement, one at a time, such surface may be of the substrate itself, or may be a structure (e.g., a die) on the substrate, and the surface or structure may modulate or otherwise change the signal S-IN. For example, there may be a change in the amplitude, frequency or phase of the signal as an indication of processing of the substrate. As changed, the signal S-IN is referred to as an output optical signal, or signal, S-OUT (FIG. 2A), that may be emitted from the chamber 48 and transmitted through the injector 51 along the optical path AP for reception by the tool 54T. Other types of optical access may be provided, such as by using other forms of the optical input signal S-IN (other than white light), or by the substrate surface, structure or process making other changes to the signal S-IN. Such other forms of optical access are included when references are made herein to "optical access", or to the signal S-IN or to the signal S-OUT.

FIG. 2A also shows that the injector 51 may be configured for such optical access by including a first bore 66 having an open, multiple, gas and optical access area 68 (FIG. 2B, identified by a double-ended arrow to indicate the entire area within the bore). The bore 66 with the area 68 provides for gas flow to the chamber 42, and for clear optical access. The clear optical access by this bore 66 with the area 68 is sufficient to transmit the optical signals S-IN and S-OUT having a normal, or desired, signal-to-noise ratio ("SNR" or "desired SNR"). Such clear optical access is referred to as the "desired optical access" and the optical access area 68 providing such desired optical access may be referred to as a "desired optical access area". The signal S-IN is transmitted through an optical access window 70 into the injector 51 and into the chamber 42. The signal S-OUT is also transmitted out of the chamber 42 and through the injector and through the optical access window 70 to the tool 54T (FIG. 7B). With respect to the signal S-IN, and to the signal S-OUT transmitted out of the injector through the optical access window 70 to the tool 54T, for example, this desired SNR is defined as that required by the tool 54T for accurate process analysis, diagnosis or measurement, for example.

The desired optical access (in response to a signal S-OUT having the desired SNR) may enable the tool 54T to accurately indicate the processing of the substrate. In general, this desired SNR may be typical of the SNR of a signal input to a monitoring tool 54T such as an interferometer or spectrometer, for example. The bore 66 with the desired optical access area 68 is thus configured to facilitate the monitoring by exemplary interferometric or spectroscopic observation of chamber processes so that the signal S-OUT is representative of the exemplary surface of, or structure on, the substrate.

With input to the tool 54T of the signal S-OUT being the desired optical access providing the desired SNR, the SNR may be referred to as being "high enough" for the tool 54T to accurately indicate the processing of the substrate. Thus, the signal S-IN entering the bore 66 to be directed onto the substrate has a relatively high SNR that is "high enough", and the signal S-OUT exiting the bore 66 and transmitted through the injector 51 and the optical access window 70 still has the relatively high SNR that is "high enough", all absent the interference described below. Considering interference, even if the bore 66 is configured to facilitate transmission of the desired SNR and provide the desired optical access, without the improvements of embodiments of the present invention the signals S-IN and S-OUT may be interfered with and may have a substantially lower than normal, i.e., lower than desired, SNR, such that the resulting optical access may not be the desired optical access. The interference may be by conditions along, or leading to, the optical path AP. For example, if the optical window 70 of the injector 51 becomes etched or coated with deposited particles, both the S-IN and the S-OUT will have a reduced SNR, the tool 54T may be rendered unable to accurately indicate the processing of the substrate, and the optical access may not be the desired optical access. Such coating may result from an undesired plasma igniting (or lighting up) within the injector 51. Particles created by the plasma may deposit on the optical window 70, reducing the SNR of each signal S-IN and S-OUT, which again may render the tool 54T unable to accurately indicate the processing of the substrate. References herein to "improved optical access" provided by the embodiments of the injector 51 indicate that the injector 51 is configured to reduce such etching and coating of the optical window of the injector 51, and to reduce the likelihood of the undesired plasma lighting up within the injector 51, so that the SNR of each of the S-IN and the S-OUT may remain at the desired SNR, that is high enough for the tool 54T to accurately indicate the processing of the substrate, i.e., to provide the above "desired optical access".

Without the use of the shield 52, the electric field 62 may extend between turns of the coil 60 above the top of the window 48 and may extend in the window 48 through the port 50. This generation of the electric field 62 without the use of the shield embodiments of the Second Prior Invention tends to induce the undesired plasma in the port 50 within the access region 53. For example, the tendency may be to induce the undesired plasma in the bore 66 through which the gas is supplied, as described below. The undesired induced plasma may result in undesired deposition of particles on various parts within the process chamber 42, including on the substrate (which lowers process yield) and on the optical access window, which as described above reduces the SNR of the signals S-IN and S-OUT. Even if the bore 66 is configured to facilitate transmission of the desired SNR (e.g., with a desired optical access area), and even if such a shield 52 is used, to meet the increased industry standards for access to the processing chamber the improvements of embodiments of the present invention are needed to minimize reduction of the desired SNR, i.e., so that the signal S-OUT is input to the tool 54T having the desired SNR.

The embodiments of the present invention may be used to substantially avoid the problems caused by such undesired plasma induced in the access region 52, while providing other advantages described below. FIG. 2A shows the process chamber window 48 in relation to the access region 53, and a longitudinal axis X of the window 48 is identified for reference. In the use of embodiments of the injector 51 of the present invention, the large diameter window section 50E may receive the shield 52 for protecting the access region 53 and the injector 51. FIG. 2A shows one end of the shield 52 received and held in the large diameter section 50E by a foot 52F as more fully described in the First Prior Application.

Figure 3A:
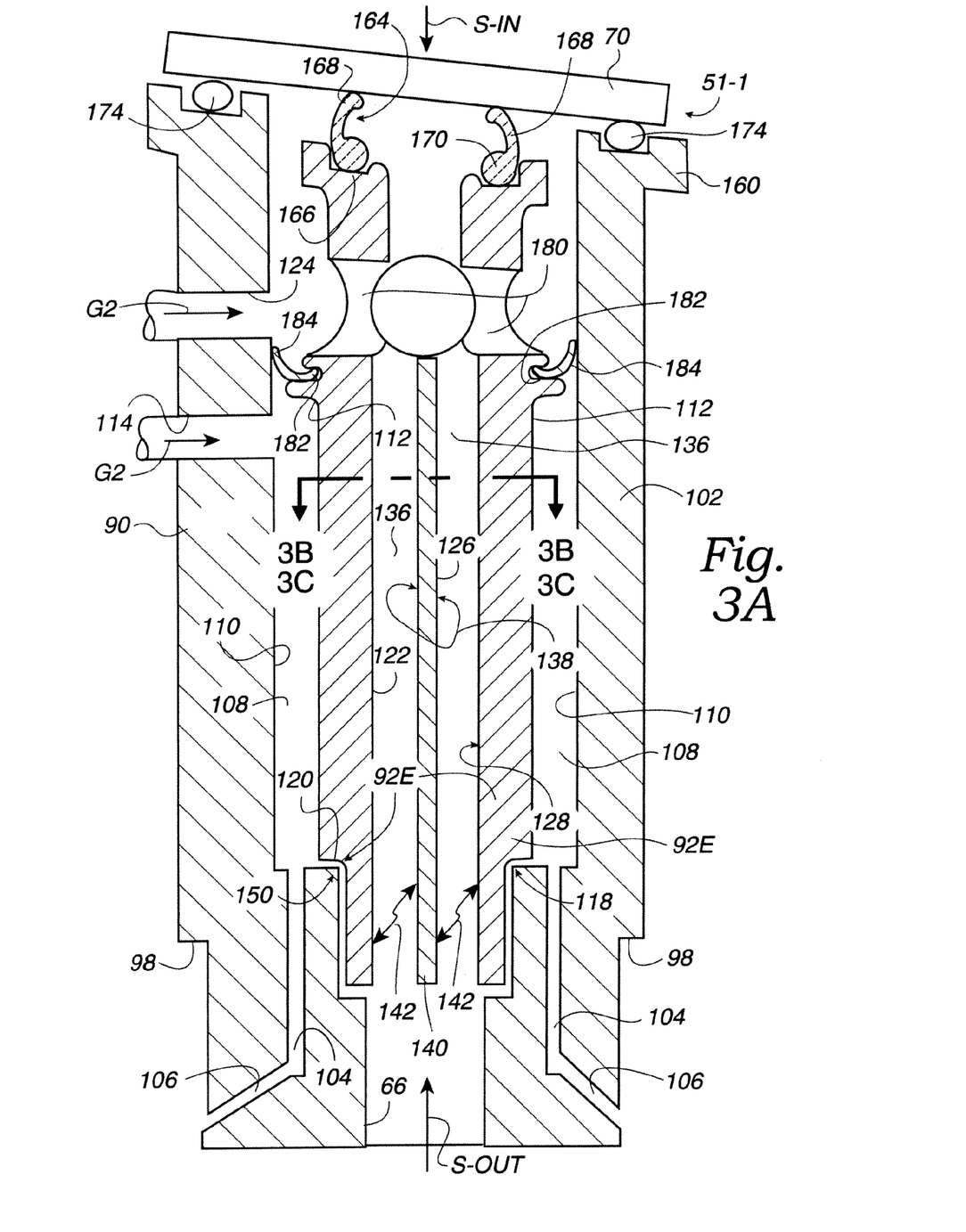
FIG. 3A is a cross-sectional view of an embodiment of the injector of FIG. 2A, illustrating a two-piece injector configuration comprising the housing and a sleeve received in the housing, and showing a septum received in the sleeve to provide improved optical access to the process chamber.

The injector 51 is configured in two parts. A housing 90 is shown in FIG. 2A and a sleeve 92 is received in the housing (FIG. 3A). FIG. 2A shows that a large diameter section of the housing is received in the section 50E of the port 50, and a small diameter section is received in the small section 50S. When the housing is received in the port, a housing shoulder 98 may rest against an opposite shoulder 100 of the port, so that an end 90E (FIG. 2A) of the housing extends into the process chamber 42. To the extent that the injector 51 and the shield 52 overlap, the injector 51 is within the shield 52 and is protected from the electric field 62.

FIGS. 2A and 3A show that the housing 90 is configured with a hollow body 102. The end 90E of the hollow body 102 is configured with a plurality of gas distribution bores 104 that may distribute process gas (e.g., a first gas) G1 (FIG. 3A) to the process chamber 42 via a plurality of nozzles 106. The sleeve 92 may be configured for reception in the hollow body 102 to define a first gas supply bore 108 for supplying the first process gas G1 to the gas distribution bores 104, and then to the nozzles 106 and the process chamber. The first gas supply bore 108 may be annular in shape as defined by an annular space between an inner wall 110 of the body 102 and an outer surface 112 of the sleeve. The gas G1 is supplied to the first bore 108 by a port 114 in the wall 110 of the body 102.

FIG. 2A also shows the injector 51 configured with the bore 66. The bore 66 is configured with a section 116 extending between a stepped shoulder 118 (FIG. 3A) and the end 90E. As described above, the bore 66 is configured with the area 68 (FIG. 2B) sufficient to transmit the optical signals S-IN and S-OUT having the desired SNR, and the section 116, for example, serves this purpose.

Figure 3B:
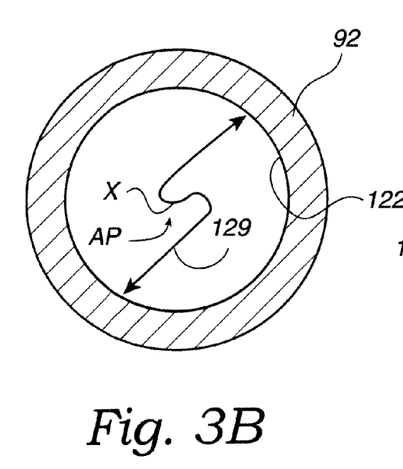
FIGS. 3B and 3C are cross-sectional views of the embodiment of the injector of FIG. 3A taken on line 3A/B in FIG. 3A showing in cross section a clear optical access area of the sleeve (FIG. 3B) and in cross section clear optical access areas defined by a septum (FIG. 3C)

FIG. 3A shows that at the stepped shoulder 118 the wall 110 of the hollow body 102 becomes thinner to receive the sleeve 92 and form the gas bore 108. The stepped shoulder 118 cooperates with a shoulder 120 of the sleeve 92 as described below. The sleeve 92 is configured as a hollow tube having an inner wall 122 (FIG. 3B). The housing 90 is configured with a second port 124 to supply second gas G2 to the sleeve 92, for delivery to the bore 66. FIG. 2A shows that the bore 66 is partly surrounded by the lower end of the shield 52, and may introduce the second process gas G2 into the chamber 42. The process gas G2 introduced by the bore 66 may be different from the gas G1 supplied by the first gas supply bore 108 and gas distribution bores 104 and nozzles 106, for example, and may vary according to the type of processing to be done in the chamber. The process gases G1 and G2 may also be supplied, for example, at different mass flow rates, and the gases may be the same gas, for example.

As described above, the analysis in the Second Prior Application indicated that for the gas supply aspect of the multiple use of an injector there was a need for a relatively small diameter (exemplary diameter D1 significantly less than 0.5 inch) of an exemplary circular gas bore. The need for this small diameter was to avoid plasma formation in the gas bore. As described below, the embodiments of the injector 51 are configured to overcome this conflict between the high desirability of using a larger (e.g., 0.5 inches) aperture and the need for a relatively small dimension of such aperture for the gas supply, and these embodiments overcome this conflict by providing the desired optical access.

FIG. 3A illustrates a configuration of the injector 51 to overcome this conflict in providing the multiple, gas and optical access, to and from the chamber 42. FIG. 3A, a cross-sectional view of an embodiment of the injector of FIGS. 2A and 2B, illustrates the two-piece injector 51 as an embodiment 51-1. Embodiment 51-1 may include the housing 90 and the sleeve 92 received in the housing. The injector configuration includes a septum 126 that may be received in the tubular inner wall 122 (FIG. 3C) of the sleeve 92, and may include the optical access window 70 that may be mounted on the housing. In a general sense, when the housing 90 is mounted (as shown in FIG. 2A) in the port 50 in the chamber window 48, the sleeve 92, septum 126, and optical access window 70 are assembled with the housing as shown in FIG. 3A. In such assembly, the housing 90, sleeve 92 and septum 126, with the optical window 70, may combine to provide the above-described "desired optical access" into and from the chamber 42 along the axial path AP. The desired optical access is relative to the noted exemplary diagnostic end point outside the chamber 42 (e.g., relative to the tool 54T, FIG. 7B). Such desired optical access is also the "improved optical access" described below.

As described above, whichever type of optical access is provided (e.g., the collimated white light or another type of optical signal S-IN), conditions along or leading to the optical path AP may interfere with the signals S-IN and S-OUT, such that the SNR of the signals may become substantially lower than the desired SNR. The above-described "desired optical access", that avoids such substantially lower than desired SNR, may be provided by the embodiments of the injector 51 that are configured to reduce the above-described etching and coating of the optical window 70, and to reduce the likelihood of a plasma lighting up within the injector 51, so that the SNR of each of the S-IN and the S-OUT may remain at the desired level, described above as being high enough for the tool 54T to accurately indicate the processing of the substrate. The configuration of these embodiments of the injector 51 to provide the "improved (or desired) optical access" is referred to herein as the "improved optical access configuration", which may be as follows.

Figure 3C:
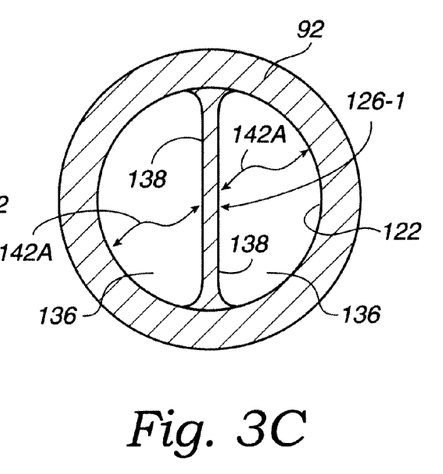

The septum 126 may be configured for reception in the tube defined by the inner wall 122 of the sleeve 92 for allowing the desired (or improved) optical access. The configuration of the inner wall 122 of the sleeve 92 (without the septum 126) defines an open area 129 (indicated by a double-ended arrow to denote the entire area inside wall 122). The open area 129 is of the tube defined by the sleeve 92 for gas flow and is also sufficient to transmit the signals S-IN and S-OUT having the desired SNR, as defined above. The septum 126 divides the open area 129 into at least two apertures 136 (FIGS. 3A and 3C). Each aperture 136 is configured with a wall 138 that extends parallel to the axial path AP from a location aligned with the port 124 to an end 140 (FIG. 4) of the sleeve. The wall 138 of each aperture 136 may also include a portion of the inner wall 122 of the sleeve. Each of the apertures 136 is configured by the septum 126 to provide a dimension across the aperture 136 smaller than a corresponding dimension of the wall 122 of the sleeve 92, and to define an area 142A that is less than the area 129 of the wall 122 of the sleeve. One aspect of the reduced area 142A is that there are more collisions between the walls 122 and 138 of the apertures 136 and particles (e.g., from the chamber or etched from the surface 128), which promotes deposition of the particles on the walls 122 and 138 of the apertures 136 before the particles reach the optical access window 70. Another aspect of the reduced areas 142A is to suppress light up of plasma in the apertures 136. Any tendency for plasma light up has a reduced effect because plasma does not form in a sheath around the surface 138 of the smaller-dimension apertures 136, which reduces the extent of any plasma in the smaller-dimension apertures 136, and thus reduces etching of the optical access window 70 by plasma. It may be understood that the deposition of the particles on the walls 122 and 138 of the apertures 136 before the particles reach the optical access window 70 results in a reduced likelihood of the optical access window 70 becoming coated with deposited particles, and avoids that one cause of a reduced SNR of both the S-IN and the S-OUT. Also, suppression of light up of plasma in the optical signal apertures 136, and the sheath in the smaller-dimension of the aperture 136, not only reduce the likelihood that a plasma will light up but restrict the size of any such plasma. Also, with a plasma less likely to form, and with a smaller plasma if one is formed, etching of the optical access window 70 may be substantially reduced. The reduced deposition on and etching of the window 70 serve to maintain a higher SNR in each aperture 136, and an SNR within the desired SNR. As described above, the input to the tool 54T of the signal S-OUT having the desired SNR enables the tool 54T to accurately indicate the processing of the substrate. In more detail, each aperture 136 allows transmission of a portion of both of the optical signals S-IN and S-OUT that are transmitted in the bore 66. The configuration of the plurality of apertures 136 is such that there is defined a collective, or aggregate, open area 142 (FIG. 3C). The area 142 is defined by combining the areas 142A of all individual apertures 136 in the septum 126. Thus, the area 142 is defined by the area of the at least two apertures 136, and is about the same as the area 129 of the sleeve 92 without the septum 126. Each area 142A is defined by the septum 126 that defines the apertures 136, and is the area of an aperture 136 between the location aligned with the port 124 to the end 140 of the sleeve. The collective area 142 is sufficient to maintain the SNR of the optical signals S-IN and S-OUT high enough for the tool 54T to accurately indicate the processing of the substrate. In review, each of the open areas 142A defined by the septum 126 may be referred to as a multiple, gas and optical access, area in that each open area 142A provides both the gas access for the exemplary gas G2 and, with the other areas 142A, provides the desired optical access, as defined above. Also, it is these areas 142A that combine to form the collective area 142 that provides the desired optical access.

Figure 4:
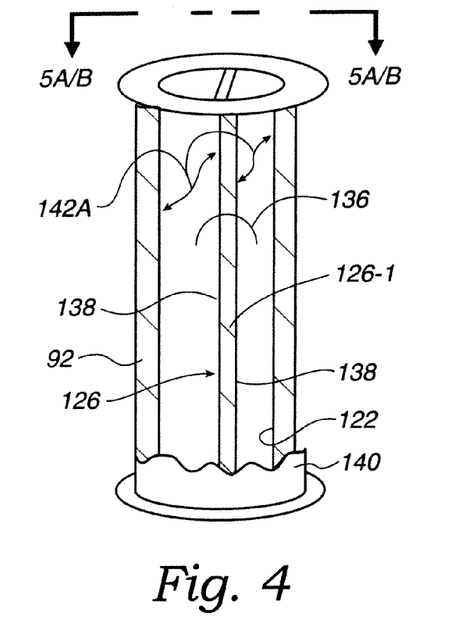
FIG. 4 is an enlarged cross-sectional view of the sleeve and septum shown in FIGS. 3A and 3C, illustrating the septum dividing the clear optical access area into exemplary two multiple access gas and optical signal apertures.

FIG. 4 illustrates one embodiment 126-1 of the septum 126, and shows a reference line 5A/B indicating respective embodiments 126-2 and 126-3 of the septum 126. FIGS. 3C and 4 show the embodiment 126-1 of the septum 126 in which the wall 122 is circular and the septum is configured in the form of one web that bridges across the diameter of the circular wall 122. The web divides the open exemplary circular area 129 defined by the wall 122 into two of the apertures 136, each extending parallel to the axial path AP and along the complete length of the sleeve 92 and of the septum 126-1. FIG. 3A shows that the septum 126-1 is configured to extend from the port 124 to the end 140 as described below.

Figure 5A:
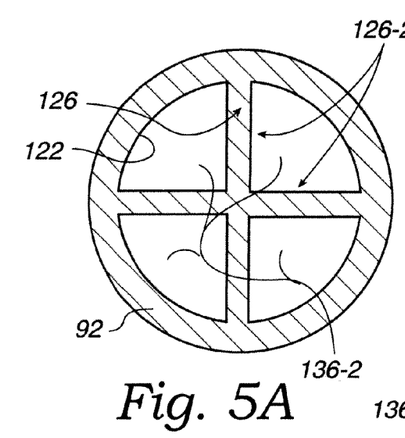
FIGS. 5A and 5B are plan views taken along line 5A/B in FIG. 4, illustrating exemplary configurations of the septum shown in FIG. 4.

FIG. 5A illustrates the embodiment 126-2 of the septum 126 in which the wall 122 is also circular, and the septum 126 is configured in the form of one X-shaped web that bridges across two diameters of the circular wall 122. Alternatively, the web may be configured from more than one member, wherein the many members cooperate to define the X-shape. The web of the septum 126-2 divides the open exemplary circular area 129 defined by the wall 122 into four of the apertures 136-2, each extending parallel to the axial path AP and along the complete length of the septum 126. The septum 126-2 is configured to extend from the port 124 to the end 140 as described below.

Figure 5B:
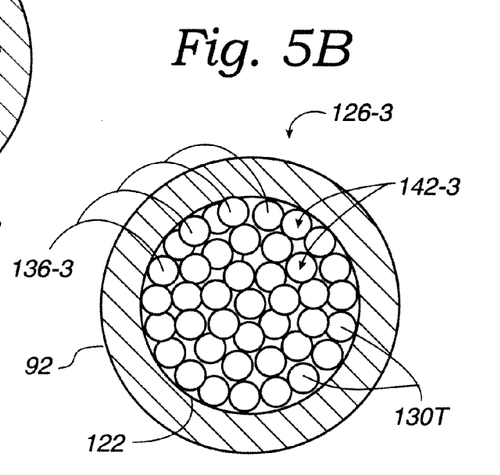

The septum embodiments 126-1 and 126-2 may be configured by machining a solid rod of material to define the webs, for example. Alternatively, the web of the septum 126 may be welded or otherwise secured to the wall 122 of the sleeve 92. Also, as shown in FIG. 5B, the embodiment 126-3 of the septum 126 may be configured in the form of pre-formed open tubes 130T received in the wall 122 that is also circular. The septum 126-3 is configured so that the tubes 130T touch each other as a bundle by being press fit into the sleeve 92 if the sleeve is, e.g., made from a polymer such as PTFE. Alternatively, the sleeve may be made from an initially solid core and drilled to form holes similar to the tubes 130T. The open tubes 130T divide the open exemplary circular area 129 (FIG. 3B) defined by the wall 122 into embodiments 136-3 of the apertures 136, one aperture 136-3 corresponding to each of the tubes, with each tube extending parallel to the axial path AP and along the complete length of the septum. Each aperture 136-3 allows transmission of a portion of both of the optical signals S-IN and S-OUT that are transmitted in the bore 66. The configuration of the plurality of apertures 136-3 is such that there is defined an embodiment 142-3 (see double-headed arrow in FIG. 5B) of the collective, or aggregate, open area 142 described with respect to FIG. 3C. This area 142-3 is defined by the sum of the areas within the total number of apertures 136-3, and is about the same as the area 129 of the sleeve 92 without the septum 126. This collective area 142-3 is thus defined by the collective areas 142-3A of the apertures 136-3. The collective area 142-3 is sufficient to maintain the SNR of the optical signals S-IN and S-OUT high enough for the tool 54T to accurately indicate the processing of the substrate.

Other (e.g., non-circular) configurations of the septum 126 (e.g., 126-x, not shown) may be provided, and serve in the manner described below to overcome the conflict between the high desirability of using a large aperture for optical access, and the need for a relatively small dimension of an aperture for the gas supply. Each such embodiment 126-1 through 126-3, and 126-x, is configured to have the "improved optical access configuration", in which the open (exemplary circular) area 129 defined by the wall 122 is divided into the gas/optical signal apertures 136, each extending parallel to the axial path AP and along the complete length of the septum 126. Each aperture provides the above-described clear optical access. In respect to each such embodiment 126-1 or 126-2 or 126-3 or 126-x, for example, the configuration of the gas/optical signal apertures 136 is such that the collective, or aggregate, open area 142 defined by the internal areas of all of the gas/optical signal apertures 136 together is sufficient to enable the SNR of the optical signals S-IN and S-OUT to be high enough for the tool 54T to accurately indicate the processing of the substrate. Further, in the continued use of such embodiments 126-1 or 126-2 or 126-3 or 126-x, for example, because of the described configuration of the septum 126, the resulting reduced deposition on and etching of the window 70 serves to maintain that higher SNR which tends to enable the tool 54T to continue accurately indicating the processing of the substrate.

The above-described retention of the desired SNR of the signals S-IN and S-OUT despite use of the many smaller-dimension gas/optical signal apertures 136 of the various embodiments of the septum 126 (e.g., less than 0.5 inch) is contrary to the prior teaching of a minimum 0.5 inch diameter of a clear optical aperture to facilitate monitoring of an optical signal that indicates a process condition in the process chamber for the exemplary interferometric or spectroscopic observation of chamber processes. For example, those teachings would prevent use, for the gas supply aspect of the dual use, of a relatively small dimension (significantly less than 0.5 inch) of the gas/optical signal apertures 136 of the septum 126 for supply of the gas G2 to the chamber 42 and optical access, while avoiding plasma formation inside the surface 128.

FIG. 3A shows other details of the two-piece injector 51. FIG. 3A shows an embodiment of a Z interface between the shoulder 118 of the housing 90 and a corresponding end 92E of the sleeve 92. The shoulder 118 and end 92E are configured with complementary surfaces that mate to form an interface 150. Among the many functions (described below) the interface 150 restricts, or limits, a flow of the first gas G1 from the bore 108 to the bore 66, and also restricts, or limits, a flow of the second gas G2 from the apertures 136 to the bore 108, both referred to as "low flow conductance".

Figure 6:
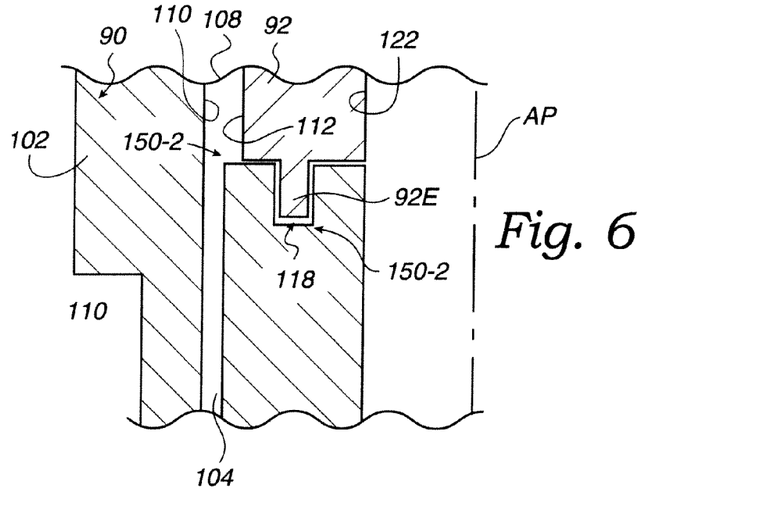
FIG. 6 is a cross-sectional view of a portion of the two-piece injector of FIG. 3A, illustrating an enlarged portion of the one end of the housing and the corresponding end of the sleeve, showing a U-shaped embodiment of an interface between one end of the housing and a corresponding end of the sleeve for minimizing particle generation in the injector.

FIG. 6 is a cross-sectional view of a portion of the two-piece injector 51 of FIG. 3A, illustrating an enlarged portion of the shoulder 118 of the housing and an embodiment of the corresponding end 92E of the sleeve, and showing a U-shaped embodiment 150-2 of the interface 150. The shoulder 118 and end 92E are configured with complementary surfaces that mate to form the low flow conductance interface 150-2. The shoulder 118 is shown configured with a U-shaped, stepped groove having an annular extent around the axial path AP. The end 92E is shown configured with an annular-shape projection extending around the axial path AP and into the U-shaped, stepped groove of the shoulder 118.

Figure 7A:
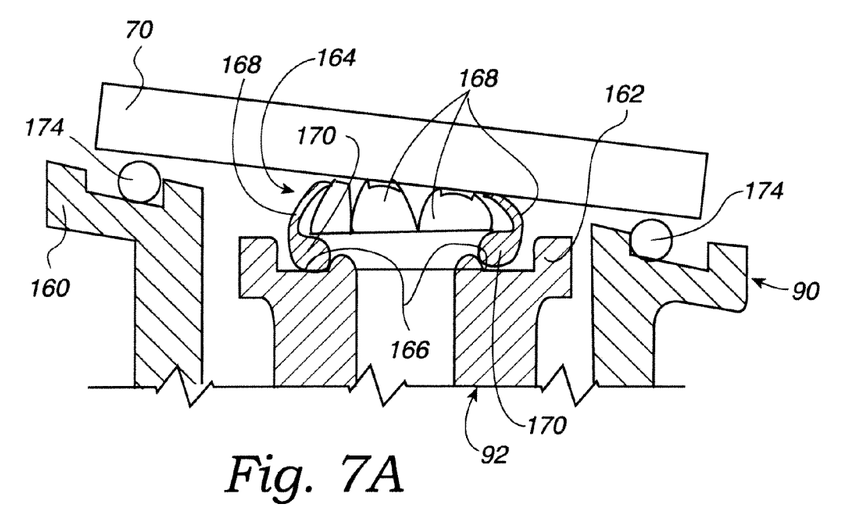
FIG. 7A is an enlarged cross-sectional view illustrating an upper end of the housing and a corresponding end of the sleeve, showing a flexure mounted on the sleeve between the sleeve and an optical window fixed to the upper end of the housing.
Figure 7B:
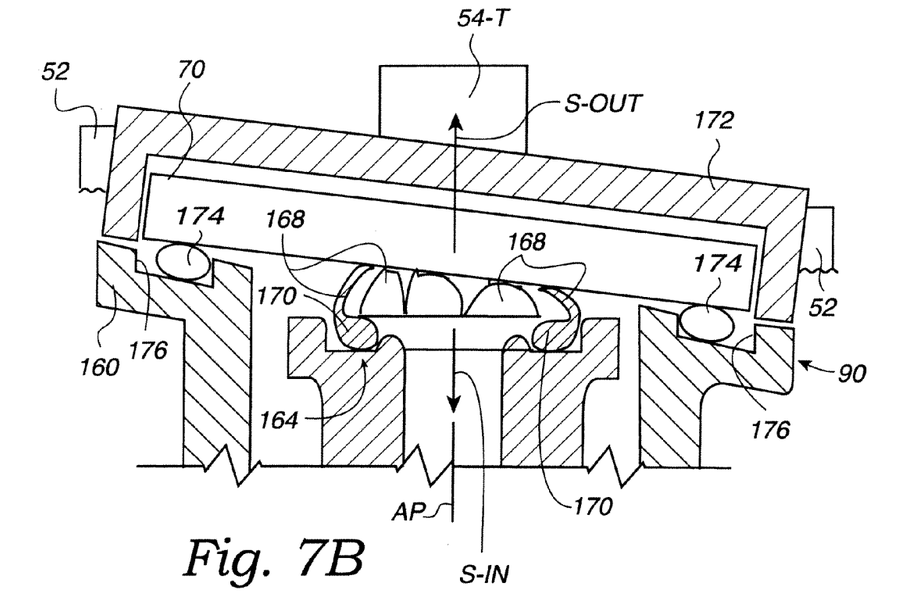
FIG. 7B is a view similar to FIG. 7A, illustrating the flexure mounted on the sleeve and compressed by the window, the compressed flexure urging the other end of the sleeve against the interface sleeve for minimizing particle generation in the injector.

FIG. 7A is an enlarged cross-sectional view illustrating an upper end 160 of the housing 90 and a corresponding upper end 162 of the sleeve 92, showing a flexure 164 mounted on the sleeve 92 between the sleeve 92 and the optical access window 70 fixed to the upper end 160 of the housing. The upper end 162 of the sleeve is shown configured with a groove 166 for receiving the flexure 164, which is annular. The groove 166 conforms to the annular configuration of the flexure. The flexure is configured with arms 168 configured to flex relative to an annular body 170 of the flexure. Application of force downwardly on the arms 168 flexes the arms and urges the body 170 downwardly against the groove 166. FIG. 7B shows that such downward force may be applied to the arms 168 by the optical access window 70 when the window 70 is held assembled with the housing 90 by a mount plate 172 of the process analysis and measurement tool 54T. FIG. 7B illustrates the flexure 164 mounted on the sleeve 92 and the arms 168 (that have been flexed by the window 70), the flexed arms and the flexure body 170 urging the other end 92E (FIG. 3A) of the sleeve 92 against the interface 150, e.g., against the shoulder 118. As to FIG. 6, the flexed arms and the flexure body 170 also urge the other end 92E of the sleeve 92 against the interface 150-2, e.g., against the shoulder 118. The end 92E urged against the shoulder 118 of each of the interfaces 150 and 150-2 provides a mating interface surface that is effective to minimize, if not eliminate, generation of particles in the injector 51. Such elimination (or minimization) results from the urging holding the end 92E and shoulder 118 tightly together so as to eliminate (or minimize) relative movement between the end and the shoulder. The lack of relative movement avoids rubbing of the end against the shoulder, and combines with the configuration of the septum 126 that fosters particle deposition on the walls 122 and 138 to deposit particles before they reach the optical window 70.

In another embodiment, minimization, if not elimination, of generation of particles in the injector 51 may result from use of a gasket between the end 92E and shoulder 118 of the interface 150. The gasket may be made from a material (such as PTFE) that has a characteristic of low particle generation, such that any motion of the end 92E relative to the shoulder 118, for example, does not result in any substantial generation of particles.

Additionally, the flexure and related structure that eliminates (or minimizes) relative movement between the end and the shoulder avoid use of any O-ring inside the sleeve 92 and inside the housing 90, which further eliminates a source of particles in the injector 51, and thus in the clear optical aperture through which the optical signals S-IN and S-OUT are transmitted.

FIG. 7B also illustrates that the force applied by the window 70 compresses an O-ring 174 into a sealing groove 176 to seal the port 124 and the gas G2 from the atmosphere, thus the O-ring is not inside the housing or the sleeve.

FIG. 3A also shows the upper end 162 of the sleeve 92 configured with openings 180 to facilitate entry into the apertures 136 of the septum 126 of the second gas G2 from the port 124. The end 162 is also configured with an annular groove 182 that extends horizontally for reception of a wiper 184. The wiper is flexible and retained in the groove for three functions. One, flexure of the wiper presses against the wall 110 between the two ports 114 and 124 to restrict, or limit, a flow of the first gas G1 from the bore 108 to the port 124. Two, the wiper 184 restricts, or limits, a flow of the second gas G2 from the port 124 to the bore 108. Third, the wiper 184 applies a force on the wall 110 of the housing to center the sleeve 92 in the hollow body 102, thus avoiding particle generation that may result if the sleeve touches the housing at this location between the ports.

It may be appreciated that the O-ring 174, the flexure 164, the interface 150, and the wiper 184 serve to enable the bore 108 and the apertures 136 of the septum 126 to define separate gas flow paths for the gases G1 and G2. In this manner, separate gas injection into the chamber 42 may be provided from the nozzles 106 (for the first gas G1) and from the injection bore 66 of the housing 90 (for the second gas G2). The separate gas flow paths for the gases G1 and G2 enable the selection during detailed design of the injector 51 of desired mass flow rate(s) of the gas(es) for obtaining desired process conditions.

Embodiments of the present invention may also include a method for providing the desired optical access to process events occurring in the process chamber. An embodiment of the method may be understood by reference to FIG. 8, which shows a flow chart 190. The method moves from start to an operation 192 of defining a multiple, gas and optical, access path that is configured to transmit an optical signal from the process chamber to an analysis tool that operates in response to the signal having a desired signal-to-noise ratio (SNR) for process analysis. The defined path configuration is unitary and capable of transmitting the desired SNR that is high enough for the tool to accurately indicate the process analysis. Operation 192 may be performed by the sleeve 92 being configured with the inner wall 122. As described above, the configuration of the sleeve inner wall 122 without the septum 126 is such that the open area 129 (FIG. 3B) defined by the inner wall 122 is sufficient to transmit the signals S-IN and S-OUT having the desired SNR, as defined above. The open area 129 of the sleeve 92 may conform to the multiple, gas and optical, access path of operation 192 in that both the gas G2 and the clear optical access are provided through the open area 129. With respect to the signal S-IN, and to the signal S-OUT transmitted out of the injector 61 through the optical access window 70 to the tool 54T, for example, this desired SNR is defined above as that required by the tool 54T for accurate process analysis, diagnosis or measurement. Operation 192 may also configure the access path with the optical access window 70 adjacent to the analysis tool 54T.

Figure 8:
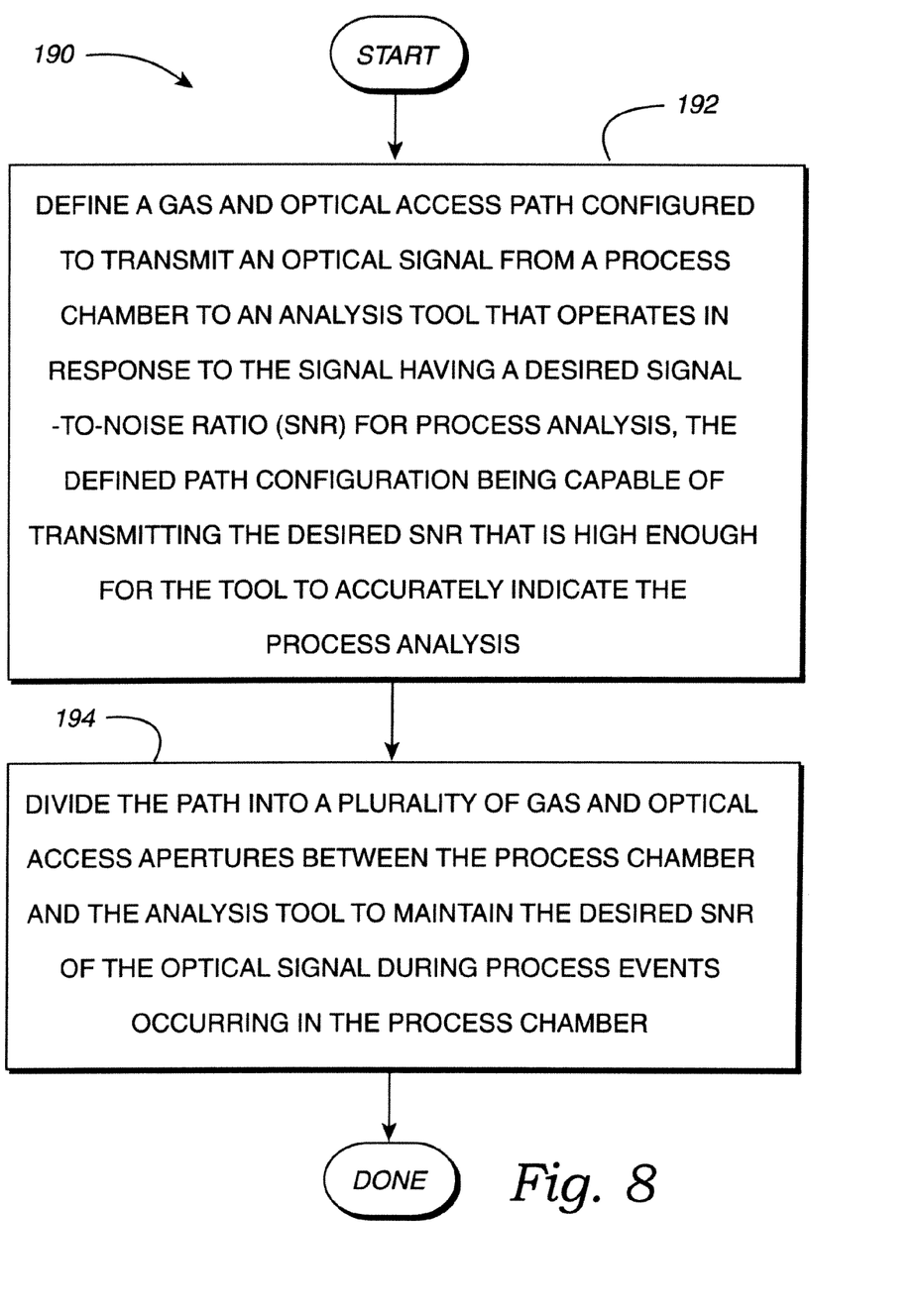
FIG. 8 is a diagram of a flow chart of a method embodiment of the present invention.

The method may move to an operation 194 of dividing the multiple, gas and optical, access path into a plurality of gas and optical access apertures that extend between the process chamber and the analysis tool to maintain the desired SNR of the optical signal during the process events occurring in the process chamber. Operation 194 may be performed by the septum 126. The septum 126 divides the open area 129 into at least two apertures 136, each of which is configured with the reduced area 142A that extends parallel to the axial path AP from a location aligned with the port 124 to an end 140 of the sleeve. The apertures 136 combine with the bore 66 and the optical access window 70 to extend between the process chamber 42 and the analysis tool 54T. Also, the configurations of the apertures 136 collectively maintain the desired SNR of the optical signals S-IN and S-OUT during the process events occurring in the process chamber 42.

In more detail, operation 194 may configure the size of the apertures 136 closer to the mean free path of particles in the gas and optical access apertures 136 to promote collisions between the particles and the walls 122 and 138 of the apertures 136. These collisions reduce the energy of the particles and increase deposition of the particles on the walls 122 and 138 of the apertures 136 before the particles reach the optical access window 70. The configuration in operation 194 may also configure each of the apertures 136 with a portion of the wall surface 122 and with the septum surface 138 and provide the dimension across the aperture 136 smaller than a corresponding dimension of the sleeve wall 122, and with the area 142A that is less than the area 129 of the inner wall 122 of the sleeve. The smaller apertures 136 result in more collisions between the surfaces 122 and 138 of the apertures 136 (on the one hand) and particles (e.g., from the chamber or etched from the surface 122 or 138) on the other hand, reducing the energy of the particles and promoting deposition of the particles on the surfaces 122 and 138 of the apertures 136 before the particles reach the optical access window.

The smaller apertures 136 resulting from operation 194 are configured to be effective to suppress light up of plasma in the apertures 136. Any plasma light up has a reduced effect because plasma does not form in a sheath around the surface 128 of the smaller-dimension apertures 136. The sheath reduces the extent of any plasma in the smaller-dimension apertures 136, reducing etching of the optical access window 70 by plasma. The operation 194 result of deposition of the particles on the surfaces 128 of the apertures 136 before the particles reach the optical access window 70 also results in a reduced likelihood of the optical access window 70 becoming coated with deposited particles, and avoids that cause of a reduced SNR of both the S-IN and the S-OUT. Also, with a plasma less likely to form, and with a smaller plasma if one is formed, etching of the optical access window 70 will be substantially reduced. By operation 194, the reduced deposition on and etching of the window 70 serve to maintain a high SNR of the signal S-OUT transmitted through the window 70. As described above, the input to the tool 54T of the signal S-OUT having the desired SNR enables the tool 54T to accurately indicate the processing of the substrate.

Operation 194 may perform the dividing by providing walls separating the gas and optical path into a plurality of gas and optical apertures. Each of the apertures may be an aperture 136 as described above, and may be separate from all of the other gas and optical passages. This dividing operation may be performed by the septum 126, to divide the open area 129 into the apertures 136, each of which is configured with the walls 122 and 138 that extend parallel to the axial path AP. As described above, operation 194 results in deposition of particles on the surfaces 122 and 138 of the apertures 136 before the particles reach the optical access window 70. Collectively, all of the plurality of gas and optical apertures 136 are configured to transmit the optical signal S-OUT through the optical window 70 to the analysis tool 54T, wherein the optical signal S-OUT has the desired SNR that may still be high enough for the tool 54T to accurately indicate the processing of the substrate, as described above.

Another embodiment of the method of flow chart 190 may include an operation of removing the deposit of particles from the walls 138 of the apertures 136. For such operation, the sleeve 92 and septum 126 may be removed from the housing 90, and the apertures 136 cleaned before replacing the sleeve and septum in the housing. In another embodiment, a cleaning operation may be performed in the process chamber 42 to remove the deposit of particles from the walls 122 and 138 of the apertures 136, thus avoiding opening the chamber 42.

In summary, the described embodiments of the present invention meet the above-described need for further improvements to provide the above-defined multiple access to a process chamber. The problem defined above is overcome by a problem solution providing further improvements in accessing processing chambers, and providing such improved access when the access is for dual zone gas supply, and when the optical access is subject to the above conflicting requirements. Further, the problem solution is accomplished without the four considerations identified above in paragraph 0005. Initially, the injector 51 provides the above-defined clear optical access and desired optical access.

These needs are also met, and the problem solution is accomplished, without depositing damaging amounts of particles on an optical access window leading into the injector. Oppositely, it is shown above that the septum 126 is configured to provide a dimension across the apertures 136 smaller than a corresponding dimension of the sleeve wall 122, and with the areas 142A that are each less than the area 129 of the wall 122 of the sleeve, increasing the number of collisions by particles with the walls 122 and 138 of the apertures 136. More collisions between particles and the wall 122 and 138 of the surfaces 138 promotes deposition of the particles on the surfaces 122 and 138 of the apertures 136 before the particles reach the optical access window 70. This deposition of the particles on such surfaces results in a reduced likelihood of the optical access window 70 becoming coated with deposited particles, and avoids that cause of a reduced SNR of both the signal S-IN and the signal S-OUT.

These needs are also met, and the problem solution is accomplished, while facilitating geometric advantages in the improved injector 51. For example, as described with respect to FIGS. 3A and 6, facilities are provided for minimizing, if not eliminating, particle generation in the injector 51. For example, the described cooperation of the optical window 70, flexure 164, and shoulder 118 of the interface 150 with the end 92E results in the downward force applied to the arms 168 by the optical access window 70 urging the end 92E of the sleeve 92 against the shoulder 118 of the interface 150, which is effective to minimize, if not eliminate, particle generation in the injector 51. Additionally, the urged end 92E and interface 150 maintain the flows of the gases G1 and G2 effectively apart.

These needs are met, and the problem solution is accomplished, without requiring the injector 51 to be fabricated from a particular material, and instead by allowing use of various materials for the various one of the housing 90, the sleeve 92, and the septum 126. Many combinations of material may be used according to the present invention. For example, in one embodiment, the housing, the sleeve and the septum may be made from either coated or uncoated ceramics or polymers. The ceramics may be the same as those described in the First Prior Application or in the Second Prior Application, e.g., alumina, ceria, yttria, and zirconia. Quartz may be used if the process, for example, is compatible with quartz. Exemplar polymers include PTFE, ETFE, CTFE, FEP, and others sold under the trademark TEFLON; polyetherimide (Ultem); polycarbonate (Lexan); polyetheretherketone (PEEK); and polyimide (Vespel). In general, advantages of low cost result from use of polymers for all of these parts, and combine with ease of manufacture as compared to ceramics. For example, if criteria of a plasma etch application (i.e., substrate type, gases, temperature, power, etc.) are compatible with a particular polymer, then all of these components may be made from that polymer. Of particular advantage is making the housing 90 from a polymer as this alleviates a need for the coating that some ceramics require. It may be understood that a most plasma-resistant embodiment (i.e., most resistant to plasma and high electric fields) is an "all-ceramic" configuration in which each of the housing, sleeve and septum is made from ceramic. Such an all-ceramic configuration allows for the widest plasma etching compatibility due to the better resistance of ceramics to the plasma. The housing 90, that is exposed to the most intense plasma, may require a ceramic coating, but the sleeve 90 and septum 92 may be uncoated ceramic because the sleeve and septum do not experience the same high intensity of plasma. In another embodiment, a combined ceramic-and-polymer configuration may have advantages. The housing 90 may be made from a ceramic for plasma resistance, whereas the sleeve 92 and septum 126 may be made from polymer since these are not located in the same intense plasma as the housing. This allows use of the injector 51 in harsh (intense) plasmas because the ceramic housing 90, whether or not coated, resists the plasma, and the sleeve 92 and septum 126 may be polymer allowing a complex sleeve-septum configuration that is easier to manufacture.

These needs are also met, and the problem solution is accomplished, without requiring long spacing of the optical access window 70 from the process chamber window 48, where the long spacing is in an attempt to avoid damage to the optical access window 70. An exemplary configuration of the injector 51 may provide the septum 126 in the sleeve 92, and the septum 126 defining about 20 exemplary separate optical signal apertures 136, each having a diameter of about 0.90 inches and a length inside the sleeve 92 of about three inches, as shown in FIG. 5B.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for optical access to process events occurring in a process chamber, the method comprising the operations of:
   defining a gas and optical access path having an axial orientation from a substrate when present in the process chamber and an optical access window of the process chamber, the gas and optical access path being configured to simultaneously carry gas and transmit an optical signal from the process chamber to an analysis tool that operates in response to the signal having a desired signal-to-noise ratio (SNR) for process analysis, the defined path configuration being capable of transmitting the desired SNR that is high enough for the tool to accurately indicate the process analysis; and
   dividing the gas and optical access path having the access to the optical access window into a plurality of separate gas and optical access apertures between the process chamber and the analysis tool, the dividing provides one or more separators that define the apertures and are arranged along the axial orientation, the apertures collectively maintain the desired SNR of the optical signal transmitted to the tool.

2. A method as recited in claim 1, wherein the optical access window is adjacent to the analysis tool, and wherein:
   the dividing operation configures the apertures to reduce a likelihood of plasma formation in the separate gas and optical access apertures, increase depositing of particles in the apertures, and reduce numbers of particles moving past the apertures to the optical access window.

3. A method as recited in claim 2, the method comprising the further operation of removing the deposit of particles from the walls of the apertures.

4. A method as recited in claim 1, wherein the dividing operation is performed by providing walls separating the combined gas and optical path into the gas and optical apertures, the gas and optical apertures being separate from each other and being configured to collectively transmit to the analysis tool the optical signal having the desired SNR.

5. A method as recited in claim 1, wherein the dividing operation is performed using a sleeve configured with a septum, the method further comprising the operations of:
   closing the path using an optical access window mounted on a housing; and
   minimizing a generation of particles in the housing and the sleeve.

6. A method as recited in claim 5, wherein the minimizing of the generation of particles in the housing and the sleeve is performed by holding the housing and the sleeve in contact with each other.

7. A method as recited in claim 5, wherein the minimizing of the generation of particles in the housing and the sleeve is performed by providing a gasket between the housing and the sleeve, the gasket being configured from a material having a characteristic of low particle generation during relative movement between the housing and the sleeve.

8. The method of claim 1, wherein the separations are defined by septums in a sleeve that fits in a center bore of a gas injector, the gas injector being defined at a top region of the process chamber.

9. The method of claim 8, wherein the sleeve extends along a single direction along the axial orientation.

10. A method for accessing a process chamber during operation to process events occurring in a process chamber, the method comprising the operations of:
    in a gas and optical access path having an axial orientation from a substrate when present in the process chamber and an optical access window of the process chamber,
        carrying gas and receiving an optical signal from the process chamber to an analysis tool that operates in response to the signal having a desired signal-to-noise ratio (SNR) for process analysis; and
        dividing the gas and optical access path having the access to the optical access window into a plurality of separate gas and optical access apertures between the process chamber and the analysis tool, the dividing provides one or more separators that define the apertures and are arranged along the axial orientation, the apertures collectively maintain the desired SNR of the optical signal received at the tool.

11. The method of claim 10, wherein the dividing operation is performed by providing walls separating the combined gas and optical path into the gas and optical apertures, the gas and optical apertures being separate from each other and being configured to collectively transmit to the analysis tool the optical signal having the desired SNR.

12. The method of claim 10, wherein the defined path configuration is capable of transmitting the desired SNR that is high enough for the tool to accurately indicate the process analysis.

13. A method of claim 10, wherein the dividing operation is performed using a sleeve configured with a septum, the method further comprising the operations of:
    closing the path using an optical access window mounted on a housing; and
    minimizing a generation of particles in the housing and the sleeve.

14. The method of claim 10, wherein the separations are defined by septums in a sleeve that fits in a center bore of a gas injector, the gas injector being defined at a top region of the process chamber.

15. The method of claim 14, wherein the sleeve extends along a single direction along the axial orientation.

* * * * *